(12) United States Patent
Schroeck

(10) Patent No.: US 9,340,897 B2
(45) Date of Patent: May 17, 2016

(54) METHOD FOR CONTROLLING THE DIAMETER OF A SINGLE CRYSTAL TO A SET POINT DIAMETER

(71) Applicant: SILTRONIC AG, Munich (DE)

(72) Inventor: Thomas Schroeck, Kastl (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 14/285,752

(22) Filed: May 23, 2014

(65) Prior Publication Data
US 2014/0360425 A1    Dec. 11, 2014

(30) Foreign Application Priority Data
Jun. 7, 2013   (DE) .......................... 10 2013 210 687

(51) Int. Cl.
C30B 15/22 (2006.01)
C30B 29/00 (2006.01)
C30B 29/06 (2006.01)
C30B 15/26 (2006.01)

(52) U.S. Cl.
CPC ................. C30B 15/22 (2013.01); C30B 15/26 (2013.01); C30B 29/00 (2013.01); C30B 29/06 (2013.01)

(58) Field of Classification Search
CPC combination set(s) only.
See application file for complete search history.

(56) References Cited

U.S. PATENT DOCUMENTS

| 5,653,799 | A | 8/1997 | Fuerhoff |
| 6,106,612 | A * | 8/2000 | White ............................. 117/14 |
| 6,203,611 | B1 | 3/2001 | Kimbel et al. |
| 2002/0043206 | A1 * | 4/2002 | Mutti et al. ...................... 117/14 |
| 2005/0211157 | A1 | 9/2005 | Radkevich et al. |
| 2009/0064923 | A1 | 3/2009 | Takanashi |
| 2010/0024716 | A1 * | 2/2010 | Orschel et al. .................. 117/15 |
| 2011/0126757 | A1 | 6/2011 | Schroeck et al. |

FOREIGN PATENT DOCUMENTS

| JP | 63021280 A | 1/1988 |
| JP | 63100097 A | 5/1988 |
| JP | 01096089 A | 4/1989 |
| JP | 07-309694 A | 11/1995 |
| KR | 2002-0059631 A | 7/2002 |
| WO | 0157294 A1 | 8/2001 |

OTHER PUBLICATIONS

Steven L Kimbel et al.: "Shape-estimation for on-line diameter calibration in Czochralski silicon crystal growth", Proc. SPIE 4188, Process Imaging for Automatic Control, 45, Feb. 2, 2001.

* cited by examiner

*Primary Examiner* — Duy Deo
*Assistant Examiner* — Erin Bergner
(74) *Attorney, Agent, or Firm* — Brooks Kushman P.C.

(57) ABSTRACT

The diameter of a single crystal is controlled to a set point diameter during pulling of the single crystal from a melt contained in a crucible and which forms a meniscus at a phase boundary on the edge of the single crystal, the meniscus having a height which corresponds to the distance between the phase boundary and a level of the surface of the melt outside the meniscus, comprising repeatedly:
  determining the diameter of a bright ring on the meniscus;
  calculating a diameter of the single crystal while taking into account the diameter of the bright ring and the dependency of the diameter of the bright ring on the height of the meniscus and on the diameter of the single crystal itself; and
  calculating at least one manipulated variable for controlling the diameter of the single crystal on the basis of the difference between the calculated diameter of the single crystal and the set point diameter of the single crystal.

11 Claims, 4 Drawing Sheets

METHOD FOR CONTROLLING THE DIAMETER OF A SINGLE CRYSTAL TO A SET POINT DIAMETER

CROSS-REFERENCE TO RELATED APPLICATIONS

This application claims priority to German Patent Application No. DE 102013210687.4 filed Jun. 7, 2013 which is herein incorporated by reference.

BACKGROUND OF THE INVENTION

1. Field of the Invention

The invention relates to a method for controlling the diameter of a single crystal to a set point diameter during the pulling of the single crystal from a melt which is contained in a crucible.

2. Description of the Related Art

The CZ method is a method which is used on the industrial scale, in order for example to produce silicon single crystals which are processed further to form wafers. The wafers are needed as substrates for the production of electronic components. In order to produce a silicon single crystal by the CZ method, silicon is melted in a crucible, and a seed crystal is immersed in the melt and raised out from the melt. After the elimination of dislocations, the desired single crystal grows at the lower end of the seed crystal. The growth of the single crystal comprises a starting phase and an end phase, during which the diameter of the single crystal is increased and decreased, respectively. This is normally done by changing the lift rate with which the seed crystal is raised. During a phase between the starting phase and the end phase, efforts are made to keep the diameter of the single crystal as constant as possible, because only the section of the single crystal which is pulled during this phase is processed further to form wafers.

At the phase boundary on the edge of the single crystal, the melt forms a meniscus. The meniscus is a region in which the melt extends downward with a particular curvature from the phase boundary on the edge of the single crystal to the level of a surface of the melt outside the meniscus. The outer edge of the meniscus is the place where the meniscus reaches the level of the surface of the melt. The height of the meniscus is the vertical distance between the phase boundary and the level of the surface of the melt outside the meniscus. The phase boundary on the edge of the single crystal is the place where the growing single crystal, the melt and the surrounding atmosphere meet. A tangent to this phase boundary and to the meniscus makes an angle with the vertical, the value of which depends on the height of the meniscus.

Under ideal conditions, which represent cylindrical growth of the single crystal with a constant set point diameter of the single crystal, the single crystal grows with a growth rate which corresponds to the value of the lift rate, but is opposite to the direction of the lift rate. Under these conditions, the height of the meniscus corresponds to the height $z_0$. The angle between the tangent to the meniscus and to the phase boundary and the vertical has the value $\beta_0$ under these conditions.

If the height $z$ of the meniscus or the meniscus angle $\beta$ deviates from $z_0$ or $\beta_0$, respectively, the single crystal will grow inward or outward and the actual diameter $D_{cr}$ of the single crystal will deviate from the set point diameter. With $z > z_0$, or $\beta < \beta_0$, the derivative of the diameter with respect to time will be $dD_{cr}/dt < 0$, or vice versa.

Various methods for controlling the diameter of a single crystal are known. For example, they may be distinguished by the variable manipulated for the control. In this context, control by means of the manipulated variable lift rate $v_p$ or the manipulated variable electrical power $L_r$ of a heat source, which annularly encloses the single crystal, are to be highlighted. Both variants have the advantage that deviations of the diameter of the single crystal from the set point diameter can be reacted to with relatively fast response time. JP1096089 A2, WO 01/57294 A1 and US 2011/0126757 A1 contain examples of these methods.

US 2009/0064923 A1 describes a method in which the height of the meniscus is used in order to control the diameter, the height of the meniscus being derived by evaluating the brightness distribution in the course of the observation of a bright ring. The bright ring is a reflection on the meniscus, which is caused by neighboring components of the device for pulling the single crystal being reflected in the meniscus. Such components are in particular the crucible wall and the lower end of a heat shield, which usually encloses the single crystal, and, if present, a heat source which annularly encloses the single crystal. According to US 2009/0064923 A1, it is assumed that the position with the greatest brightness on the bright ring represents the location of the phase boundary on the edge of the single crystal, and the level of the surface of the melt outside the meniscus can be detected by means of the observed brightness distribution.

This assumption, however, is only an approximation of the physical situation. Furthermore, the fact that a short-term change in the height of the meniscus has no significant effect on the growth rate of the single crystal remains ignored. Accordingly, control of the diameter of the single crystal on the basis of the aforementioned method is inaccurate.

SUMMARY OF THE INVENTION

It is an objective of the present invention to provide an improved method for controlling the diameter of a single crystal to a set point diameter, which involves smaller changes of the manipulated variable used for the control.

These and other objects are achieved by a method for controlling the diameter of a single crystal to a set point diameter during the pulling of the single crystal from a melt which is contained in a crucible and forms a meniscus at a phase boundary on the edge of the single crystal, the meniscus having a height which corresponds to the distance between the phase boundary and a level of the surface of the melt outside the meniscus, comprising repeatedly conducting the following steps:

determination of the diameter of a bright ring on the meniscus;

calculation of a diameter of the single crystal while taking into account the diameter of the bright ring and while taking into account the dependency of the diameter of the bright ring on the height of the meniscus and on the diameter of the single crystal itself; and calculation of at least one manipulated variable for controlling the diameter of the single crystal on the basis of the difference between the calculated diameter of the single crystal and the set point diameter of the single crystal.

The aforementioned steps are carried out repeatedly, in which case the time intervals between the repetitions may be the same, although they need not be the same. As manipulated variables of the control, the lift rate $v_p$ or the electrical power $L_r$ of a heat source which annularly encloses the growing single crystal, or both, are preferably used. The method is preferably used for the production of silicon single crystals.

DETAILED DESCRIPTION OF THE PREFERRED EMBODIMENT(S)

Figure 1:
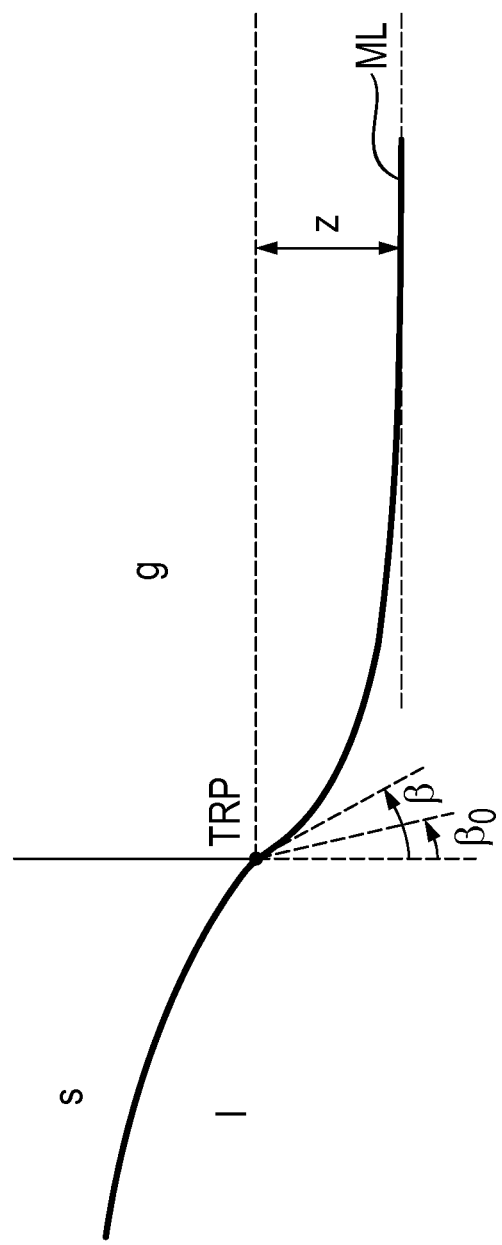
FIG. 1 shows the vicinity of the phase boundary between the growing single crystal, the melt and the surrounding atmosphere.

The growth rate $v_{cr}$ of the single crystal and the difference $\Delta\beta(z)=(\beta(z)-\beta_0)$ are the crucial variables which cause changes in the diameter of the single crystal as a function of time:

$$dD_{cr}/dt = v_{cr} \times 2\tan\Delta\beta(z) \qquad (1)$$

The difference $\Delta\beta$ between the meniscus angles $\beta$ and $\beta_0$ depends on the height z of the meniscus.

The growth rate $v_{cr}$ of the single crystal is dictated primarily by the temperature field at the crystallization boundary. It is therefore influenced essentially by the electrical power $L_f$ of a heat source which is arranged around the crucible, as well as by temperature variations in the melt as a result of the heat supply by the heat source.

A change in the height z of the meniscus as a function of time is given according to Equation (2), it being assumed that the lowering of the level of the surface of the melt due to the decrease in the volume of the melt because of the growth of the single crystal is compensated for exactly by the raising of the crucible:

$$dz/dt = v_p - v_{cr} \qquad (2)$$

If this is not the case, then the difference between the rate of the change in the level of the surface and the rate of the crucible movement must be added to the right-hand side of the equation.

A change in the lift rate $v_p$ has the direct effect that the height z of the meniscus and the meniscus angle $\beta$ also change. The growth rate initially remains uninfluenced by such a change in the lift rate $v_p$. The invention takes into account this and the fact that the diameter of the bright ring depends on the diameter of the single crystal and on the height of the meniscus. If higher-order terms of a series expansion are neglected, the diameter $D_{br}$ of the bright ring and the diameter $D_{cr}$ of the growing crystal are interrelated by Equation (3).

$$D_{br} = D_{cr} + f_{cr}(D_{cr}) + f_z(z) \qquad (3)$$

Accordingly, two further terms are of importance for the calculation of $D_{cr}$, namely a component $f_{cr}(D_{cr})$ relating to the diameter of the bright ring, the value of which depends on the diameter of the single crystal and therefore on the radial position of the meniscus, and a component $f_z(z)$ relating to the diameter of the bright ring, the value of which depends on the height of the meniscus and therefore on the shape of the meniscus.

If Equation (3) is differentiated with respect to time, Equation (4b) is obtained via Equation (4a) by rearrangement, and Equation (5) is obtained by substituting Equation (1) and Equation (2) into Equation (4b).

$$\frac{dD_{br}}{dt} = \frac{dD_{cr}}{dt} + \frac{df_{cr}(D_{cr})}{dt} + \frac{df_z(z)}{dt} \qquad (4a)$$

$$\frac{dD_{br}}{dt} = \frac{dD_{cr}}{dt} + \frac{df_{cr}(D_{cr})}{dD_{cr}} \times \frac{dD_{cr}}{dt} + \frac{df_z(z)}{dz} \times \frac{dz}{dt} \qquad (4b)$$

$$\frac{dD_{br}}{dt} = \left(1 + \frac{df_{cr}(D_{cr})}{dD_{cr}}\right) \times v_{cr} \times 2\tan\Delta\beta(z) + \frac{df_z(z)}{dz} \times (v_p - v_{cr}) \qquad (5)$$

It may be assumed that the growth rate $v_{cr}$ corresponds to a set point value of the lift rate $v_{ps}$, and that $df_{cr}(D_{cr})/dD_{cr} = df_{cr}(D_{crs})/dD_{cr}$ for small changes in the diameter of the crystal, where $D_{crs}$ stands for the set point diameter of the single crystal. Instead of this, however, the term $df_{cr}(D_{cr})/dD_{cr}$ may also be calculated iteratively.

According to the invention, Equation (5) is used as a basis in order first to determine the height z of the meniscus. It takes into account the change in the component relating to the diameter of the bright ring, which depends on the height of the meniscus, as a function of the change in the height of the meniscus, and weights it with a factor which depends on the lift rate $v_p$ and the growth rate $v_{cr}$.

In order to determine the diameter of the bright ring, the bright ring is observed and optically recorded, and the image is evaluated electronically at least at one point, preferably at least at three points. The three points are preferably uniformly distributed on a semicircle around the single crystal. The outer transition from dark to bright in the recorded image is interpreted as a part of a segment of a circle, the diameter of which corresponds to the diameter $D_{br}$ of the bright ring. If the evaluation at different points gives different diameters, these are averaged to form a diameter of the bright ring.

The change in the diameter of the bright ring as a function of time $dD_{br}/dt$ is obtainable by determination of the diameter of the bright ring and subsequent numerical differentiation with respect to time.

A preferred way of determining the height z of the meniscus on the basis of Equation (5) is using two look-up tables which are based on simulation data. They are compiled beforehand, that is to say before the pulling of the single crystal, and assign different heights z of the meniscus the corresponding values of $\tan\Delta\beta(z)$ and the corresponding values of $df_z(z)/dz$, respectively, at a spacing $\Delta z$ of for example 0.1 mm, for example in the range of 1 mm $\leq z \leq$ 11 mm. The simulation (ray-tracing simulation) comprises the tracing of ray paths which, coming from a camera, strike the meniscus and are reflected there into the surroundings. The simulation takes into account the configuration of the "hot zone" which is used during the pulling of the single crystal, as well as the process conditions prevailing during the pulling of the single crystal. In particular, the position and shape of the heat shield, and optionally the position and shape of the heat source which encloses the growing single crystal, and the position of the camera which records the bright ring, are taken into account. Simulation data which are based on a 2D approach are less accurate than those which are based on a 3D approach. It is therefore preferable to take this into account when compiling the look-up tables, and employ a 3D approach. In particular, the allocation of the values of $df_z(z)/dz$ at the spacing $\Delta z$ therefore becomes more accurate. The 3D approach involves determination of the diameter of the bright ring, in a similar way to real image processing, by means of simulation which sets in spatial relation the position of evaluation points on the bright ring which lie outside the plane of the camera. In the plane of the camera lie the camera, the evaluation point on the bright ring placed closest to the camera position, and the axis along which the growing single crystal is raised.

The two look-up tables are combined to form a single look-up table tab(z) in such a way that each height z is assigned the corresponding right-hand side of Equation (5), which is expressed by Equation (6):

$$\text{tab}(z) = \left(1 + \frac{d f_{cr}(D_{cr})}{d D_{cr}}\right) \times v_{cr} \times 2\tan\Delta\beta(z) + \frac{d f_z(z)}{dz} \times (v_p - v_{cr}) \quad (6)$$

During the pulling of the single crystal, the common look-up table tab(z) is employed and, depending on the lift rate $v_p$ and the growth rate $v_{cr}$, that value of z is interpolated which satisfies Equation (5) when the value that results from the differentiation of the diameter of the bright ring, which was determined beforehand, is used for the change in the diameter of the bright ring as a function of time $dD_{br}/dt$.

Another way of determining the associated height z of the meniscus on the basis of Equation (5) comprises simplification of Equation (5) by linearization of tan $\Delta\beta(z)$ and $df_z(z)/dz$.

$$2 \tan \Delta\beta(z) \approx a_t + b_t \times z \quad (7)$$

$$df_z(z)/dz \approx a_m + b_m \times z \quad (8)$$

The coefficients $a_t$, $b_t$, $a_m$ and $b_m$ may for example be determined beforehand, that is to say before the pulling of the single crystal, by the method of least squares (least square fit). After substitution of Equations (7) and (8) into Equation (5) and rearrangement, an expression which makes it possible to calculate the height z of the meniscus explicitly is obtained with Equation (9).

$$z = \frac{dD_{br}/dt - (1 + df_{cr}(D_{cr})/dD_{cr}) \times v_{cr} \times a_t - (v_p - v_{cr}) \times a_m}{(1 + df_{cr}(D_{cr})/dD_{cr}) \times v_{cr} \times b_t + (v_p - v_{cr}) \times b_m} \quad (9)$$

The value found according to Equation (6) or (9) for the height z of the meniscus is used in the next step in order to calculate the diameter $D_{cr}$ of the single crystal according to Equation (10), which is derived from Equation (3), or in order to calculate its derivative with respect to time $dD_{cr}/dt$ according to Equation (1). $D_{crs}$ denotes the set point diameter of the single crystal.

$$D_{cr} = D_{crs} + \frac{(D_{br} - D_{crs} - f_z(z) - f_{cr}(D_{crs}))}{\left(1 + \frac{d f_{cr}(D_{crs})}{d D_{cr}}\right)} \quad (10)$$

$$\frac{dD_{cr}}{dt} = v_{cr} \times 2\tan\Delta\beta(z) \quad (1)$$

With $D_{cr}$ and $dD_{cr}/dt$, the input variables for the control of the diameter of the single crystal are available in corrected form, so that the dependencies of the diameter of the bright ring on the height of the meniscus and on the diameter of the single crystal are taken into account.

As a controller for the control of the diameter of the single crystal, a PID controller or a state feedback control are preferably used.

When a PID controller is used, the difference $D_{cr} - D_{crs}$ as a system deviation e(t) and the derivative de(t)/dt as a component of the D element are introduced into the equation of the controller in order to calculate the manipulated variable u(t). The derivative de(t)/dt is determined numerically or, preferably, calculated according to Equation (1). Equation (11) describes an ideal PID controller, $k_p$ denoting the factor of the P gain, and $T_i$ and $T_D$ being the time constants of the I element and the D element, respectively:

$$u(t) = k_p \times \left(e(t) + \int \frac{1}{T_i} e(t) dt + T_D \frac{d}{dt} e(t)\right) \quad (11)$$

When a state feedback control is used, the manipulated variable u(t) is calculated according to Equation (12), $k_D$ and $k_z$ denoting feedback factors of the state variables, and $\Delta D_{cr}$ and $\Delta z$ respectively being the difference between the state variable (diameter $D_{cr}$ of the single crystal or height z of the meniscus z) and the associated set point value of the state variable ($D_{crs}$ or $z_s$, respectively).

$$u(t) = k_D \Delta D_{cr}(t) + k_z \Delta z(t) \quad (12)$$

In the starting phase and the end phase, during which the diameter of the single crystal is increased and decreased, respectively, or in order to adapt the diameter of the single crystal to the set point diameter during the intermediate phase, $z_s$ must be calculated according to Equation (13) with the aid of the set point diameter $D_{crs}$, which is specified as a function of the length of the single crystal.

$$\frac{dD_{crs}}{dt} = v_{cr} \times 2\tan\Delta\beta(z_s) \quad (13)$$

The following may preferably be used as a manipulated variable u(t) for adapting the diameter $D_{cr}$ of the single crystal to the set point diameter $D_{crs}$: the lift rate $v_p$ or the electrical power $L_r$ of the heat source which annularly encloses the single crystal, or both.

In the case in which $L_r$ is used as a manipulated variable, a predetermined set point lift rate $v_{ps}$ is departed from as little as possible. The determination of the height z of the meniscus is carried out as already explained, but with Equation (14) being used, instead of the assumption $v_{cr} = v_{ps}$, in Equations (5), (6) and (9).

$$v_{cr} = v_{ps} + \frac{dv_{cr}}{dL_r} \times \Delta L_r \quad (14)$$

In this case, $dv_{cr}/dL_r$ is preferably assumed to be constant and determined empirically. $\Delta L_r$ denotes the difference between the electrical power $L_r$ of the heat source, which annularly encloses the single crystal, and its set point value $L_{rs}$.

The manipulated variable u(t) then calculated according to Equation (11) or (12) may then be converted into a corresponding manipulated variable $u_{Lr}(t)$. For the conversion, a factor which converts u(t) into $u_{Lr}(t)$ is determined empirically. The manipulated variable $u_{Lr}(t)$ corresponds to the change in the electrical power $\Delta L_r$ of the heat source which is necessary in order to cause a change in the growth rate which brings the diameter $D_{cr}$ of the single crystal close to the set point diameter.

It is recommendable, and therefore preferred, to filter variables affected by measurement noise before use as calculation variables in the corresponding equations. This applies in particular for the following variables: the diameter $D_{br}$ of the bright ring, the height z of the meniscus, the lift rate $v_p$, and the electrical power $L_r$ of the heat source which encloses the growing single crystal. A PT1 filter with an adjustable time constant is preferably used for the filtering.

It is furthermore advantageous, and therefore also preferred, besides the described control of the diameter of the single crystal, to establish a further control loop, which reacts in the event of deviations of the lift rate $v_p$ from the set point lift rate $v_{ps}$ or deviations of the electrical power $L_r$ from the set point power $L_{rs}$, and the manipulated variable of which modifies the electrical power $L_f$ of at least one heat source which is arranged around the crucible. The further control loop therefore relieves the load on the single crystal diameter control according to the invention.

As represented in FIG. 1, the melt rises toward the phase boundary TRP on the edge of the single crystal and forms a meniscus there. The phase boundary refers to the position where the liquid phase l of the melt, the solid phase s of the single crystal and the gaseous phase g of the atmosphere meet one another. The height z of the meniscus is the vertical separation between the phase boundary TRP and the level ML of the surface of the melt outside the meniscus.

The tangent to the phase boundary and to the meniscus makes the meniscus angle β with the vertical, the value of which depends on the height of the meniscus. The single crystal is pulled with a lift rate $v_p$ from the melt and grows with a growth rate $v_{cr}$ in the opposite direction. If the single crystal grows with a constant set point diameter $D_{crs}$, then $\beta=\beta_0$, $z=z_0$ and $v_p=v_{cr}$. Such conditions are ideal for pulling the section of the single crystal which is subsequently intended to be processed further to form wafers.

In the event of deviations $\Delta z \neq 0$ ($\Delta z = z - z_0$), or $\Delta\beta \neq 0$ ($\Delta\beta=\beta-\beta_0$), the single crystal starts to grow inward or outward and the diameter $D_{cr}$ of the single crystal starts to deviate from the set point diameter $D_{crs}$. In the case of $z>z_0$ and $\beta<\beta_0$, the diameter of the single crystal becomes smaller ($dD_{cr}/dt<0$), and vice versa.

Figure 2:
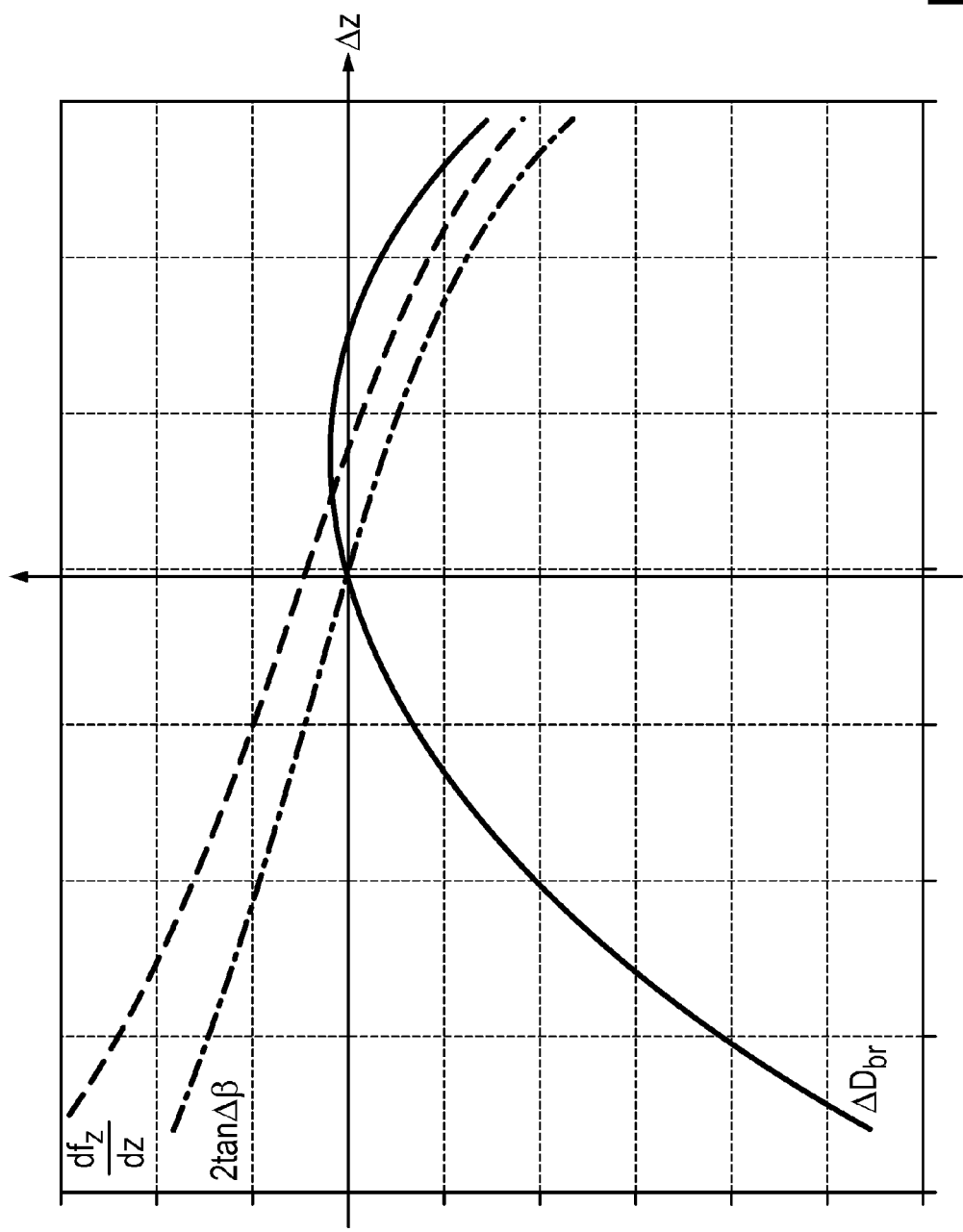
FIG. 2 shows the dependency of the diameter of the bright ring, and that of the meniscus angle, on the height of the meniscus.

As shown in FIG. 2, there is a nonlinear dependency between the diameter of the bright ring and the height of the meniscus ($\Delta D_{br}=D_{br}(z)-D_{br}(z_0)$). Likewise represented are the corresponding dependencies of the terms 2 tan $\Delta\beta(z)$ and $df_z(z)/dz$ contained in Equation (5).

Figure 3:
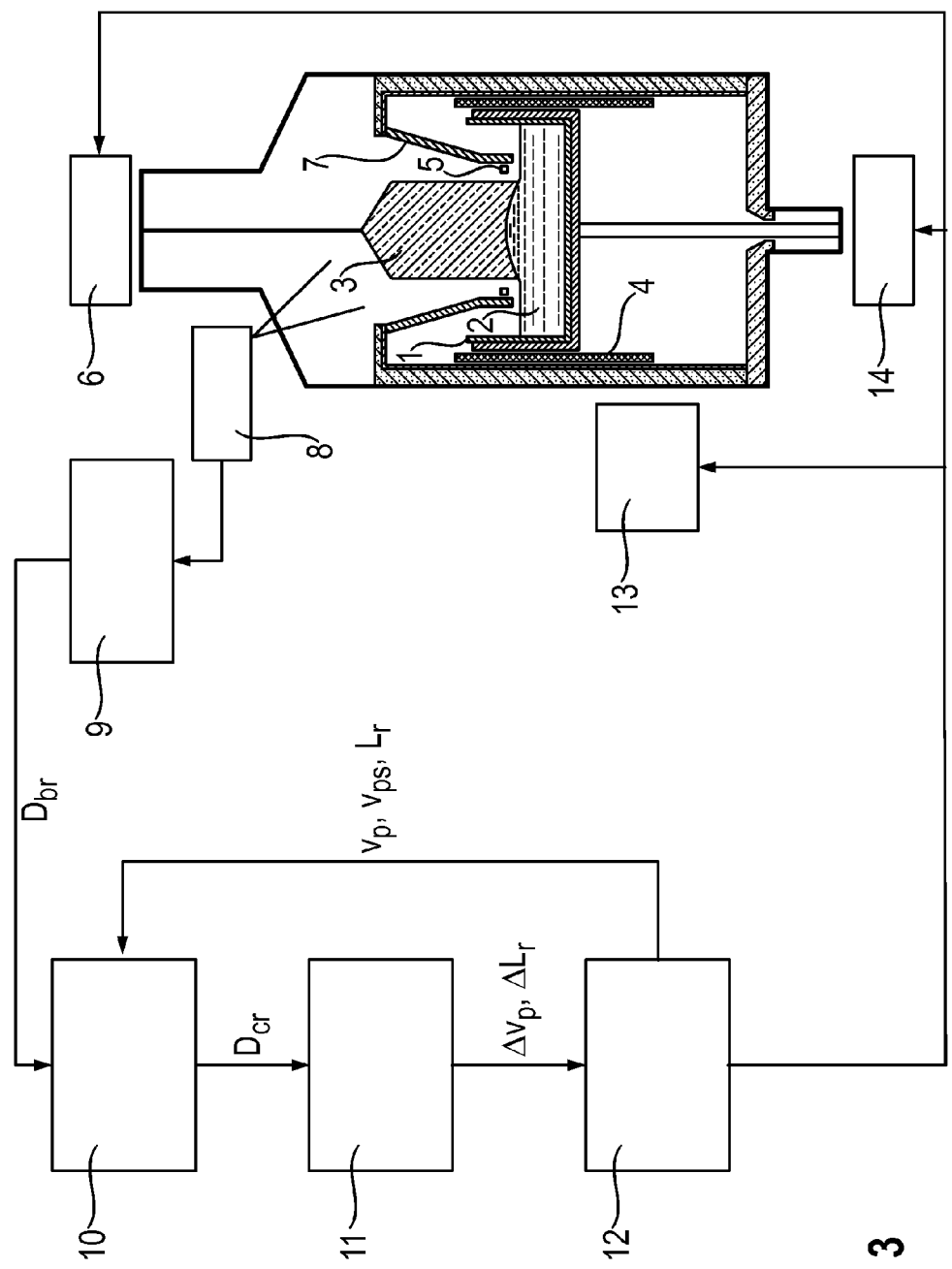
FIG. 3 shows typical features of a device which is suitable for carrying out the method according to the invention.

FIG. 3 shows typical features of a device which is suitable for carrying out the method according to the invention. The device comprises a crucible 1 which contains a melt 2, from which a single crystal 3 is pulled. A heat source 4, which keeps the melt liquid, is arranged around the crucible. An apparatus for generating a magnetic field, with which flows in the melt are influenced, is furthermore often provided. A further heat source 5 may be provided, which is arranged around the single crystal 3 and heats the region of a phase boundary between the single crystal, the melt and the surrounding atmosphere. The further heat source 5 may be used in order to control the diameter of the single crystal in the manner according to the invention. In this case, the manipulated variable of the control is aimed at influencing the electrical power $L_r$ of the further heat source 5. Instead of the further heat source 5, an apparatus 6 for pulling the single crystal from the melt, which is only indicated in FIG. 3, may also be employed in order to control the diameter of the single crystal. The manipulated variable of the control is then aimed at influencing the lift rate $v_p$ with which the single crystal is pulled upward from the melt. As an alternative to this, the electrical power $L_r$ of the further heat source 5 and the lift rate $v_p$ may be provided as manipulated variables of the control.

The volume of the melt 2 decreases with the growth of the single crystal 3, and therefore so does the level of the surface of the melt relative to the edge of the crucible. Conventionally, the crucible is raised in accordance with the volume loss of the melt so that the distance between the level ML of the surface of the melt and the lower edge of a heat shield 7, which encloses the growing single crystal, remains unchanged. If maintenance of this distance is not kept constant, the decrease in the volume of the melt must also be taken into account in the calculation of the system of the control of the diameter of the single crystal.

Further features of the device are at least one camera 8 for observing the melt 2 in the region of the meniscus and an image processing unit 9 for evaluating the image signal delivered by the camera. The evaluation comprises determination of the diameter $D_{br}$ of the bright ring and delivery thereof as input information for a compensator unit 10. There, the diameter $D_{cr}$ of the single crystal is calculated in the manner according to the invention by using this input information and sent to a controller unit 11. A PID controller or a state feedback control may preferably be envisioned as the controller unit 11. The controller unit 11 calculates the manipulated variable and makes it available to a control apparatus 12. Taking into account the manipulated variable, the control apparatus 12 undertakes the control of an electrical supply unit 13 for supplying the heat sources with electricity, the control of a crucible displacement device 14 and the control of the apparatus 6 for pulling the single crystal from the melt.

Figure 4:
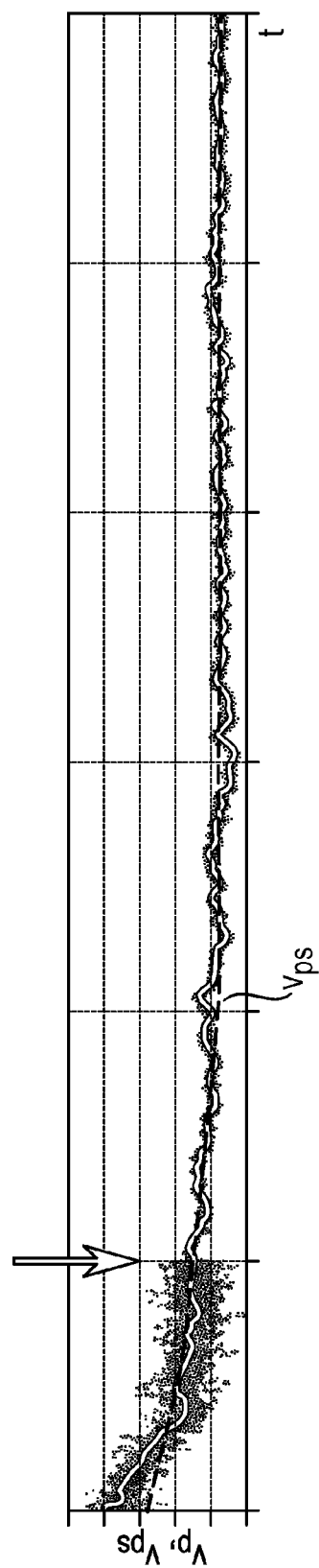
FIG. 4 shows the profiles of the lift rate $v_p$ and of the set point lift rate $v_{ps}$ as a function of time, without and with control according to the invention.

The success of the invention can be seen from FIG. 4. This shows the profiles of the lift rate $v_p$ and of the set point lift rate $v_{ps}$ as a function of time, without and with use of the control according to the invention. A silicon single crystal having a set point diameter of somewhat more than 300 mm was pulled. The profile of the lift rates reveals that, with the incorporation of the compensator unit as indicated by an arrow, the outlay which is required in order to achieve adaptation of the diameter of the single crystal to the set point diameter by changes in the manipulated variable is significantly reduced.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for controlling the diameter of a single crystal to a setpoint diameter during the pulling of the single crystal from a melt contained in a crucible wherein the melt forms a meniscus at a phase boundary on the edge of the single crystal, the meniscus having a height which corresponds to the distance between the phase boundary and a level of the surface of the melt outside the meniscus, comprising repeatedly conducting the following steps:
   determining the diameter of a bright ring on the meniscus;
   calculating a diameter of the single crystal while taking into account the diameter of the bright ring and the dependency of the diameter of the bright ring on the height of the meniscus and on the diameter of the single crystal itself; and
   calculating at least one manipulated variable for controlling the diameter of the single crystal on the basis of the difference between the calculated diameter of the single crystal and the set point diameter of the single crystal, wherein the calculated manipulated variable is supplied to a control unit which controls the diameter of the single crystal.

2. The method of claim 1, further comprising forming a look-up table which is based on simulation data and which allocates the height of the meniscus to the derivative of the diameter of the bright ring as a function of time.

3. The method of claim 1, wherein the height of the meniscus is calculated from a linearized determination equation.

4. The method of claim 1, comprising calculation of the manipulated variable as an output variable of a PID controller.

5. The method of claim 1, comprising calculation of the manipulated variable as an output variable of a state feedback control.

6. The method of claim 1, wherein a lift rate is calculated as a manipulated variable.

7. The method of claim 1, wherein an electrical power of a heat source, which annularly encloses the single crystal, is calculated as a manipulated variable.

8. The method of claim 1, wherein a lift rate is calculated as a first manipulated variable and an electrical power of a heat source, which annularly encloses the single crystal, is calculated as a second manipulated variable.

9. The method of claim 1, further comprising establishing a control loop which reacts in the event of deviations of a lift rate $v_p$ from a setpoint lift rate $v_{ps}$ or deviations of an electrical power $L_r$ from a setpoint power $L_{rs}$, the manipulated variable of which modifies the electrical power $L_f$ of one or more heat sources.

10. The method of claim 9, wherein the electrical power of a heat source located between the single crystal and a heat shield above the melt surrounding the single crystal, the heat source heating a region of a phase boundary between the single crystal and the melt, is modified.

11. The method of claim 9, wherein the electrical power $L_f$ of one or more heat sources arranged around the crucible is modified.

\* \* \* \* \*